United States Patent
Richardson

(10) Patent No.: US 9,153,718 B2
(45) Date of Patent: Oct. 6, 2015

(54) ARCUATE-WINGED SOLAR CANOPY ASSEMBLY

(71) Applicant: Donald S. Richardson, Providence, RI (US)

(72) Inventor: Donald S. Richardson, Providence, RI (US)

( * ) Notice: Subject to any disclaimer, the term of this patent is extended or adjusted under 35 U.S.C. 154(b) by 0 days.

(21) Appl. No.: 14/171,280

(22) Filed: Feb. 3, 2014

(65) Prior Publication Data

US 2014/0144490 A1 May 29, 2014

Related U.S. Application Data

(63) Continuation-in-part of application No. 12/873,174, filed on Aug. 31, 2010, now Pat. No. 8,640,394.

(60) Provisional application No. 61/306,677, filed on Feb. 22, 2010.

(51) Int. Cl.
| | |
|---|---|
| *E04B 1/34* | (2006.01) |
| *E04D 13/18* | (2014.01) |
| *E02D 27/32* | (2006.01) |
| *E04H 15/26* | (2006.01) |
| *H01L 31/042* | (2014.01) |
| *E04H 6/02* | (2006.01) |
| *F24J 2/46* | (2006.01) |
| *F24J 2/52* | (2006.01) |
| *H02S 20/10* | (2014.01) |
| *E02D 27/00* | (2006.01) |

(Continued)

(52) U.S. Cl.
CPC ............ *H01L 31/0422* (2013.01); *E02D 27/00* (2013.01); *E04H 6/025* (2013.01); *E04H 6/10* (2013.01); *F24J 2/4614* (2013.01); *F24J 2/523* (2013.01); *H02S 20/00* (2013.01); *H02S 20/10* (2014.12); *F24J 2/045* (2013.01); *Y02B 10/20* (2013.01); *Y02E 10/47* (2013.01); *Y02E 10/50* (2013.01)

(58) Field of Classification Search
CPC ........ H02S 20/00; H02S 20/10; F24J 2/5232; F24J 2/525; E04B 1/3416; E04B 1/32; E04H 6/025; E04H 12/2276; E04H 12/2215; E04H 15/58
USPC ................................ 135/99; 52/73, 74, 173.3
See application file for complete search history.

(56) References Cited

U.S. PATENT DOCUMENTS

| | | | | |
|---|---|---|---|---|
| 472,705 | A | * | 4/1892 | Heiland ........................ 52/297 |
| 498,559 | A | * | 5/1893 | Marsh ............................ 52/297 |
| 3,092,171 | A | * | 6/1963 | Deddo ........................... 160/40 |

(Continued)

*Primary Examiner* — Phi A
*Assistant Examiner* — Omar Hijaz
(74) *Attorney, Agent, or Firm* — O'Connell Law Firm; Thomas P. O'Connell

(57) ABSTRACT

A solar canopy structure mounted in ground to receive solar energy and convert the solar energy to electrical energy. The solar canopy structure has support columns, solar canopies retained in opposition by the support column, photovoltaic material retained by the solar canopies, and a block of material establishing a point of fixation along the body portion of the support column spaced from the first and second ends of the support column. At least approximately one-half of the support column can be embedded in the ground with the block of material fixed to the support column adjacent to the ground surface. The solar canopies can be have decking supported by wing arms that are joined by a central portion to form a unified, continuous wing arm structure, and the central portion can be received in and secured to a channel in the support column by first and second brackets.

11 Claims, 10 Drawing Sheets

(51) Int. Cl.
    *E04H 6/10* (2006.01)
    *F24J 2/04* (2006.01)

(56) References Cited

U.S. PATENT DOCUMENTS

| | | | |
|---|---|---|---|
| 3,335,534 A * | 8/1967 | Hester et al. | 52/169.13 |
| 5,109,643 A * | 5/1992 | Speers | 52/91.3 |
| D468,837 S * | 1/2003 | Shilling et al. | D25/56 |
| D611,405 S * | 3/2010 | Mackler | D13/102 |
| 8,444,105 B2 * | 5/2013 | Silvestri | 248/530 |
| 8,511,007 B2 * | 8/2013 | Powers, III | 52/173.3 |
| 2005/0262777 A1 * | 12/2005 | Dalo et al. | 52/73 |
| 2010/0132769 A1 * | 6/2010 | Potter et al. | 136/251 |
| 2011/0030285 A1 * | 2/2011 | Kaufman | 52/82 |
| 2011/0072740 A1 * | 3/2011 | Dieter et al. | 52/173.3 |

* cited by examiner

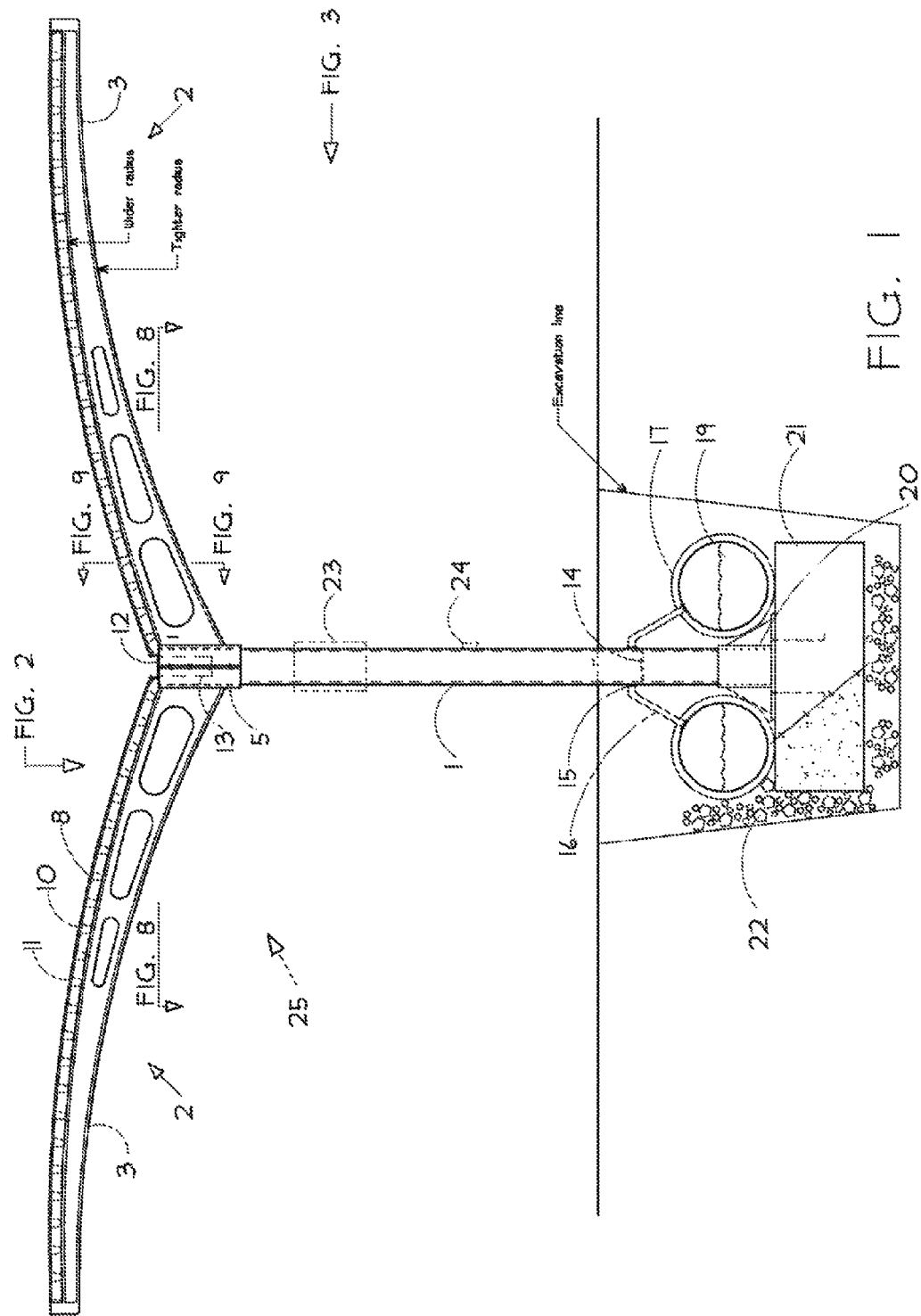

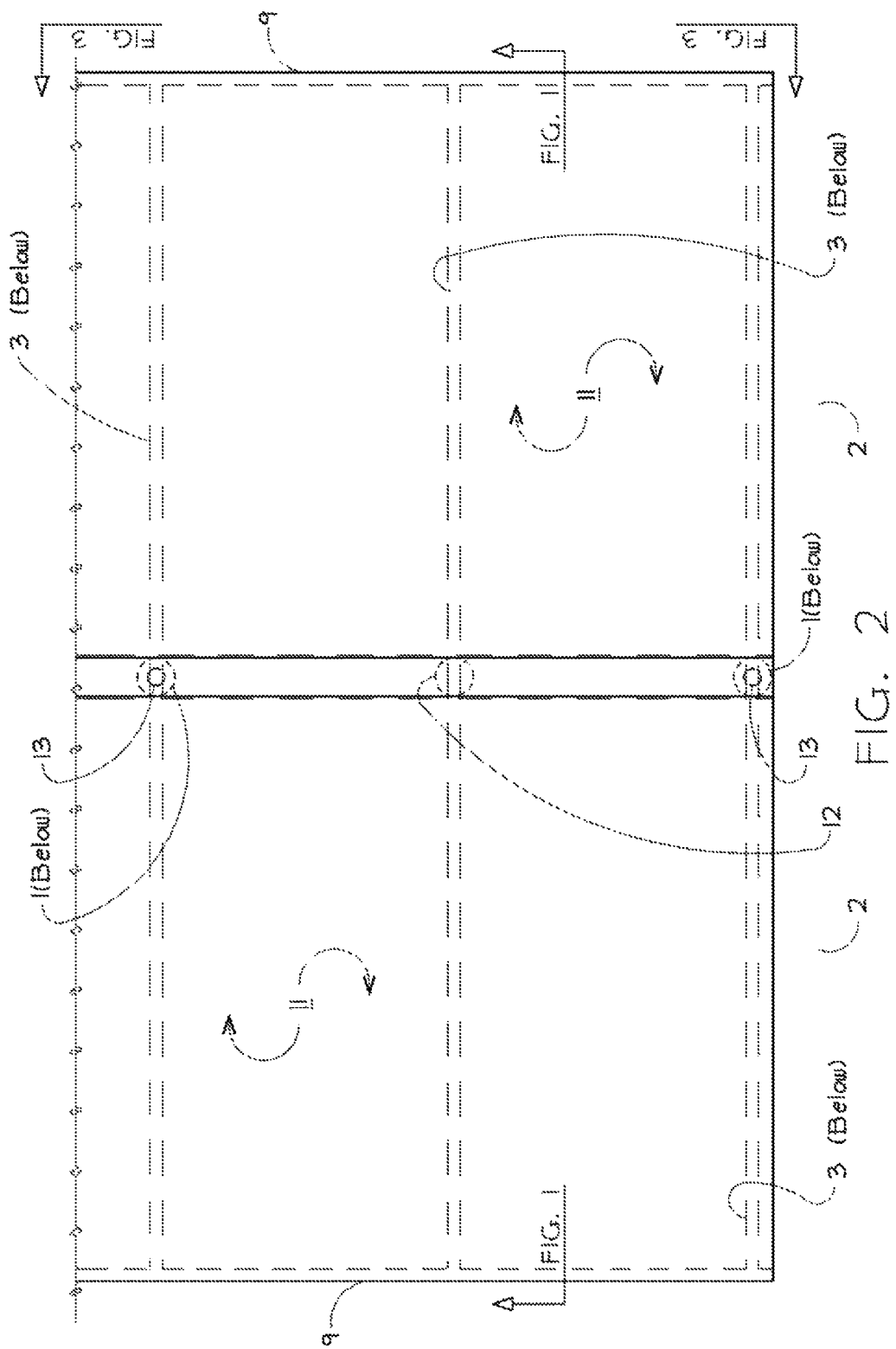

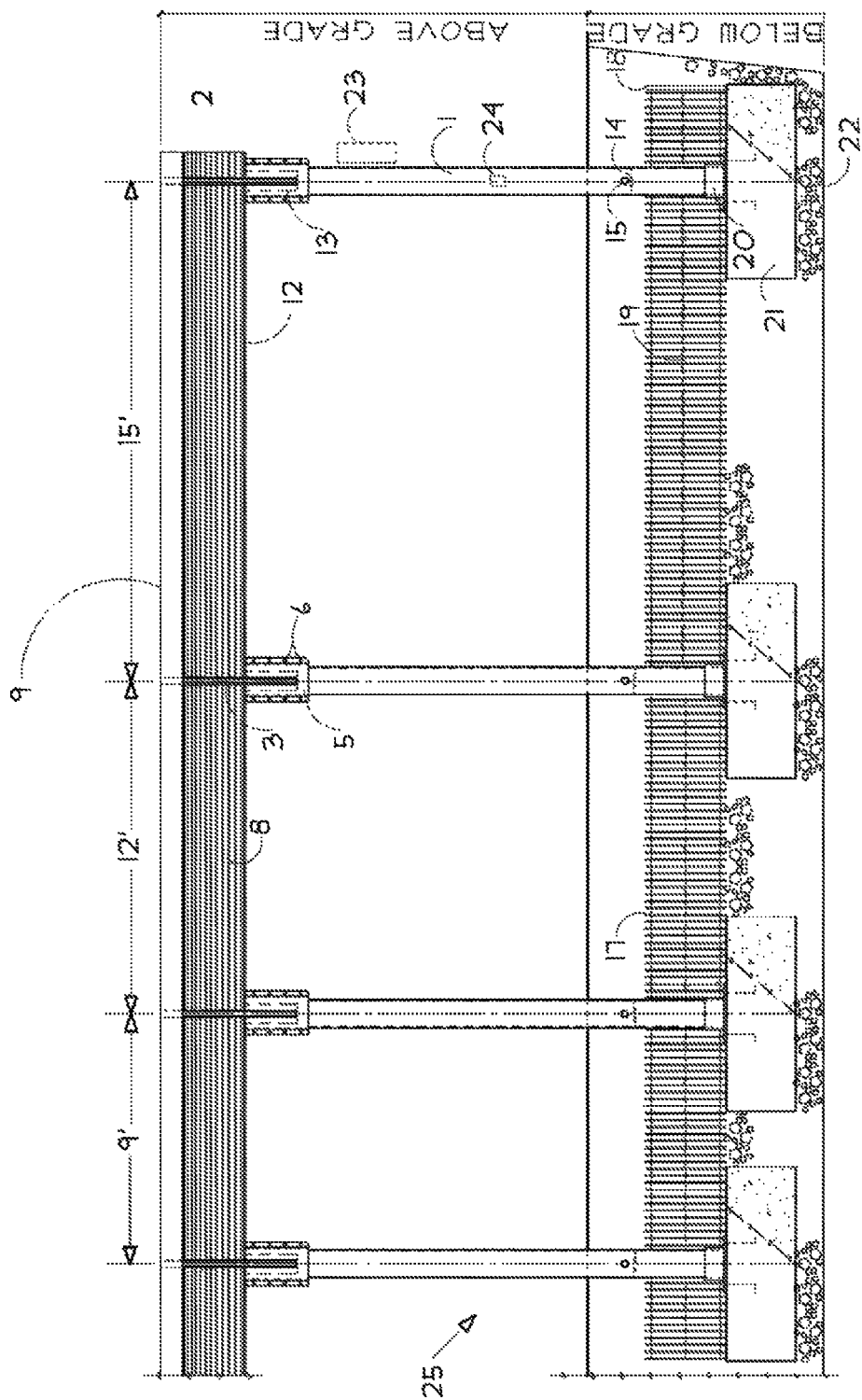

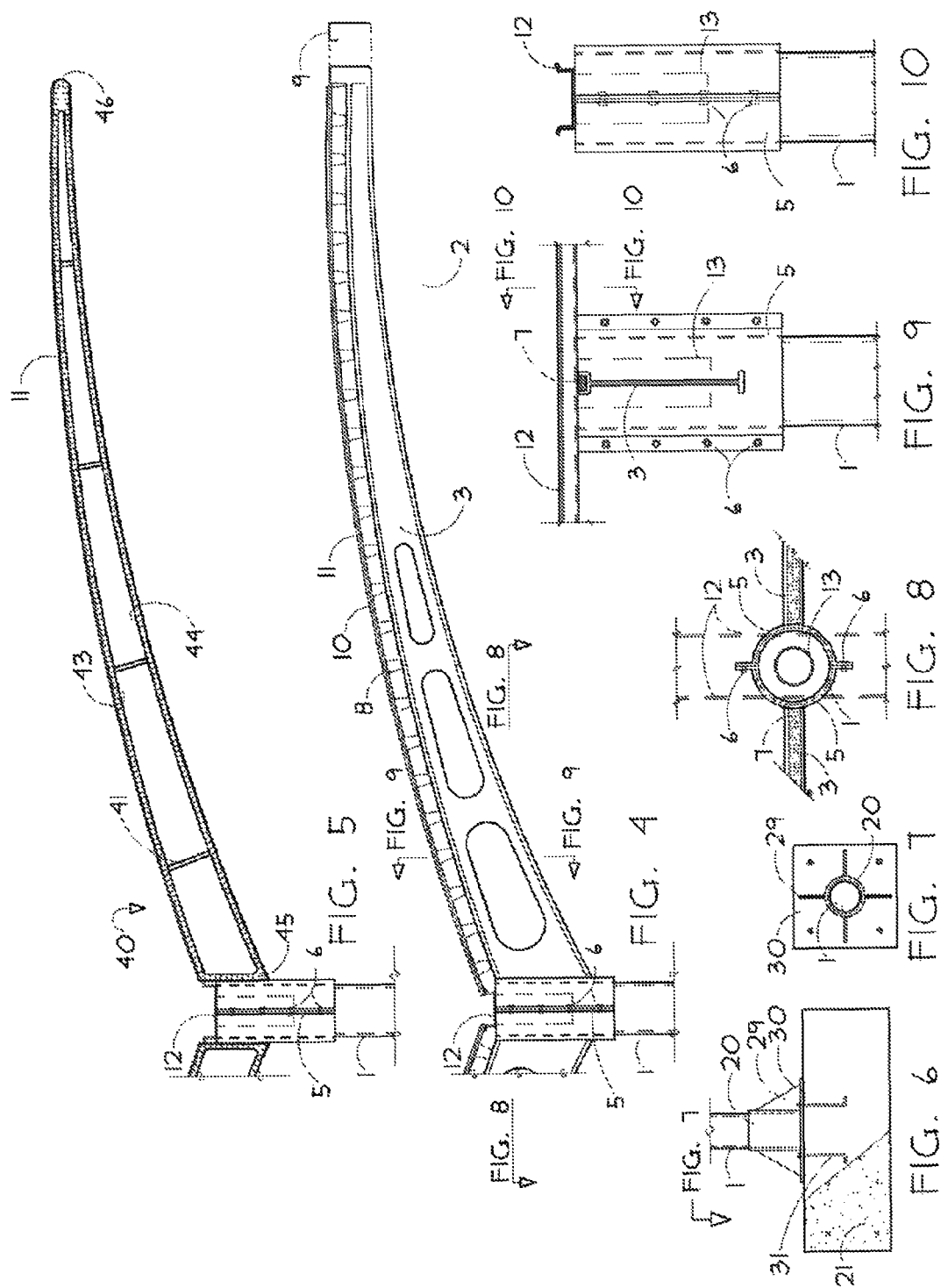

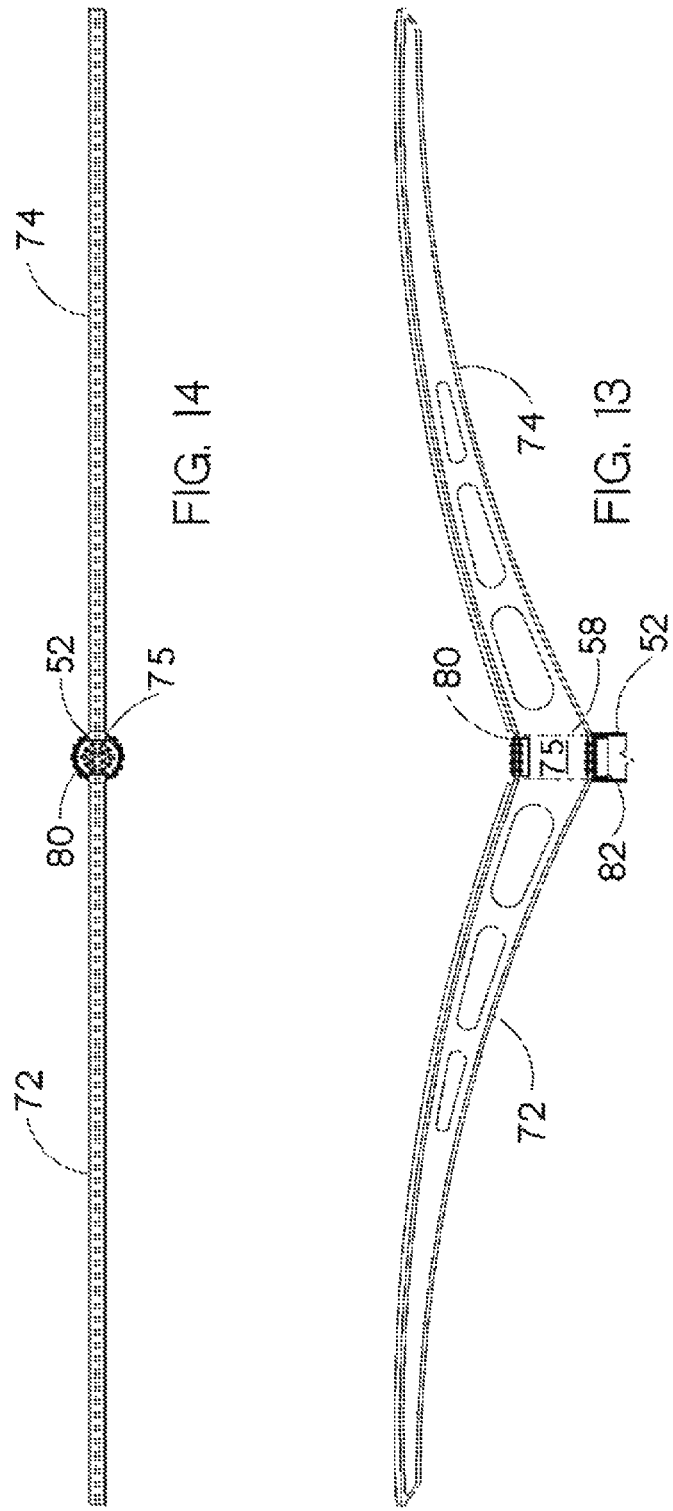

ARCUATE-WINGED SOLAR CANOPY ASSEMBLY

FIELD OF THE INVENTION

The invention relates to a lightweight, easy to assemble, arcuate-winged solar canopy assembly that that combines electric power generation with various additional uses.

BACKGROUND

Solar panels placed atop free standing structures combine power generation with, for example, shade production, which results in the maximization of the value and use of the airspace. Freestanding structures that generate electric or wind power from rooftop devices to electrically charge and run vehicles are known in the art. See for example, Japanese Patent Publication No. 09-002259, U.S. Pat. No. 6,590,363 and United States Patent Publication No. 2010/0000596 published Jan. 7, 2010. More specifically, JP 09-002259 discloses a photovoltaic power generation apparatus and a cartridge-type storage battery for a vehicle, for example a train, which can be exchanged when the vehicle is parked in a charging station having the photovoltaic power generation mounted on its roof. U.S. Pat. No. 6,590,363 discloses a charging station having a duct, a wind power generator and a battery in which the duct is formed from upper and lower panels that include a solar panel. The battery stores the power generated by the wind power generator and the solar panel and the duct is formed to collect wind blowing toward the wind power generator and to increase the speed of the collected wind. United States Patent Publication No. 2010/0000596 discloses a dual-inclination support structure having an array of photovoltaic modules mounted on its roof and having multiple uses, such as advertising, water collection, energy transmission, and the ability to place the solar cells at different angles to improve yields. Still further, United States Patent Publication No. 2010/0108113 discloses an aero-elastic solar power-generating canopy that can be formed over supporting structures without requiring an existing roof.

Certain problems are associated with the foregoing and similar approaches. The rigid solar panel installations known in the art typically are mounted atop already existing roof structures. This makes them not readily accessible, often compromises roof integrity, and results in a rigid and expensive assembly. In addition, conventional rooftop solar arrays are typically designed and disposed along a single slope plane, which may not be ideal in some locales. Further, such installations are problematic when there is snow or ice buildup in the winter. Still further, inclined, fixed plane canopies with mono-planar wings cannot maximize solar collection capability without adjustment to the wing angle.

In view of the foregoing, the present inventor recognized that it would be advantageous to have a lightweight, multipurpose solar canopy that can be assembled and disassembled easily and that maximizes solar collection capability at times associated with air-conditioning needs and peak utility needs without the need to adjust the wing angle. It was further recognized to be advantageous if the assembly was constructed of low-maintenance materials with integral finishes and if the downstream replacement or upgrade of the solar generation element represented minimal waste disposal costs and issues.

The present inventor thus proposed solutions to the foregoing and further issues and needs with his application Ser. No. 12/873,174. There, a solar canopy was disclosed with photovoltaic film or laminate panels mounted atop arcuate, curved canopy arcuate wings that met in a central trough along a structural spine of the wings. The opposed wings were supported by support columns with lower ends thereof embedded in the ground. Footings of, for example, concrete were disclosed to embed the lower ends of the columns. As such, the footings were of necessity buried relatively deep below the ground surface. In certain embodiments, water containment vessels were disclosed as being in fluidic association with the columns for receiving water collected by the wings and passed from the troughs.

This originally disclosed solar canopy structure has proven to accomplish plural advantages and, indeed, to be inventive over the prior art. However, further research and experimentation led the inventor to appreciate a number of challenges presented by the originally-conceived canopy structure, and this disclosure seeks to present inventive and structurally advantageous solutions to those challenges.

Under the teachings of the parent application, a major concrete footing was necessary under each column following the typical method of supporting a free standing column on grade. While such major footings presented a stable structure, the approach is now considered deficient in that major excavation work is necessary to accommodate the footings and, where applicable, the water containment vessels. The required excavation for such foots is significant and disruptive to the work site. Rather than being a more desirable efficient and direct installation of the solar canopy, the nature of the work came to approximate a major civil engineering project. Moreover, with the footing effectively establishing the base of the solar canopy, it required substantial use of concrete to provide the necessary weight and overall structural characteristics to resist displacement of the columns and the overall solar canopy structure in adverse weather conditions. Still further, the concrete required to form the footings has a large carbon footprint, is relatively expensive to make and transport, and has a very long and negative energy tail such that it is not environmentally benign. Even further, installation of the footings required tons of gravel as a backfill and as a drainage element enveloping the subsurface elements, again having negative energy repercussions. The large concrete footings also demanded substantial formwork, cost, and cure time during the installation process.

Witnessing the foregoing, the inventor appreciated a tangible need for an improved installation structure and method even beyond that disclosed in his original patent application. In particular, a need was appreciated for an installation method and structure that required reduced excavation and that exhibited a smaller need for retaining material and, in so doing, established a smaller carbon footprint and that could be installed with greater efficiencies in material and time.

The inventor has also come to be aware of issues and limitations relating to the original canopy wings. According to the inventor's original disclosure, each of the opposed canopy wings was founded on supportive wing arms with arcuate profiles and structurally reinforced cross-sections, such as I-shaped cross sections. The proximal ends of the wing arms are formed with or connected to semi-circular pipe sections with projected mating flanges aligned with the column axis. The flanges were bolted together to surround but not penetrate the column.

After additional structural and fabrication review, it was determined that, to be structurally effective, the flanges of the primary wing section would have to carry around the column with significant structural projection in each instance. Disadvantageously, forming such structurally supportive projections demands very deep composite casting forms at the proximal end of the wings. Milling such casting forms has proven to be complicated and awkward, and the creation of the resulting proximal ends to be time and labor intensive. Additionally, it has been found that the resulting semi-circular sections and flanges results in an undesirable aesthetic solution and that the structural integrity and durability of the formed dual wing arm structure is dependent, potentially disadvantageously so, on the performance of the fastening mechanism coupling the flanges. Still further, as a result of the protruding proximal ends where the flanges laterally project, the resulting wing arms prove difficult to stack for storage and transport.

A further avenue for desirable improvement over the inventor's original structure has thus been realized in the formation of wing arms that are efficient in construction, storage, and transportation, consistent and stable in performance, and aesthetically improved in appearance.

SUMMARY OF THE INVENTION

With a knowledge of the state of the art as summarized above, the present inventor devised of the solar canopy disclosed herein with the most basic goals of collecting solar energy when available and rain water when necessary. Solar energy is converted to electricity by, for example, photovoltaic film or laminate panels or sheets mounted atop arcuate, curved canopy structures that are formed and positioned as arcuate wings.

In one practice of the invention, rainwater is collected by low-incidence, curved wings and directed to a central trough along a structural spine of the wings. The trough can conducts the water through a support column to a water container or vessel. In a preferred embodiment, the vessel is an underground container extending parallel to and as long as the above-ground structural spine of the assembly. The low-incidence, curved wings allow for optimal solar collection, and thus power production, in mid-day during summer months in the northern latitudes when utilities often experience their highest daily and historic demand.

A principal application of the invention is for parking lots as the full canopy assembly provides site and vehicle cooling and mitigates against the albedo effect for additional environmental benefits. The invention can be used to collect solar energy and water from rain or snowmelt. Embodiments of the solar canopy can alternatively be installed in parks, marinas, walkways, remote areas, and urban areas with adequate solar access to provide electricity and to store water for later distribution. It further provides a non-polluting, zero carbon omission method of supplying electricity, and the ability to charge or recharge electric vehicles or equipment without additional fuel expenditure or supplemental connection to an existing electrical grid.

In a parking lot application, the solar canopy provides shade for vehicles thereby reducing the need for drivers to run air conditioning systems to pre-cool their vehicles prior to driving. In a farm application, the solar canopy collects water for redistribution and provides electricity to pumps and other farm equipment and provides shelter for crop, feed, animals and equipment storage. In a marine application, the canopy may be erected on a pier and provide grey water for cleaning watercraft, power for recharging boat batteries and sunshade for pier users and craft. The arcuate curvature in the winged solar canopy assembly of the invention creates what can be referred to as a waterfall effect, such that water moving toward the trough at the proximal edges of the canopy increases in speed due to the curvature and pulls the water at the distal edges of the canopy along with it. This causes the water on the distal edges of the canopy to move faster than water falling on a non-curved canopy. This sweeping of the canopy by rainfall assists in the cleaning of the assembly. In addition, the structure and shape of the canopy wing arms allow the edges to vibrate in the wind, which also facilitates the movement of water, snow and debris off the canopy.

In one embodiment, the solar canopy includes at least two pairs of dual-inclined wing structural arms. The arms are composed of a first pair of low-incidence, downwardly-curved or arcuate wing arms and a second pair of low-incidence, downwardly curved or arcuate wing arms. Each of the first and second pairs of downwardly-curved arcuate wing arms have proximal ends and distal ends. The proximal ends in each pair are arranged to be in opposed relation to each other, forming a structural spine in the assembly. The curvature in the downwardly-sloping, arcuate wing arms begins at the distal ends of the wing arms and increases in steepness toward the proximal ends and the structural spine. For stability, the wing arms increase in thickness from their distal ends, which are relatively thin, to their proximal ends, which are relatively thick. These first and seconds dual-inclined wing members are arranged in spaced apart relation to each other for reasons discussed below.

The assembly of the invention also includes at least two support columns for supporting the wing arms. A first support column is end-mounted on a ground surface or in the ground at its lower end and extends vertically along a substantially longitudinal axis to support at its other end the weight of the first pair of dual-inclined wing structural arms. A second support column is likewise end-mounted on a ground surface or in the ground and extends vertically along a substantially longitudinal axis to support at its other end the weight of the second pair of dual-inclined wing structural arms. The support columns have a height sufficient to enable vehicles to traverse or park underneath the canopy assembly. Their maximum height is limited by the length of the wing arms, the distance between them, and the overall structural integrity of the assembly. The first and second support columns and wing structural arms are in spaced-apart relation to each other. The distance between the support columns and their corresponding structural arms is variable with a typical distance being between about 9 ft and about 15 ft. Additional support columns and wing structural arms may be employed and arranged in the same fashion.

A pair of arcuate canopy decks is formed and positioned to span from one wing arm pair to another wing arm pair and is mounted on the top surface of each wing arm at the deck edges. The decks are further formed and positioned to follow the curvature of the pairs of low-incidence, arcuate wing arms. The length of each deck substantially conforms to the length of the wing arm, and the width of each deck is such that the deck can be mounted at it edges onto the top of wing arm. Each of the canopy decks in the assembly is composed of a corrugated structural sheet or its equivalent demountably coupled or affixed to the top of the wing arms, a substrate layer superposed and mounted on the corrugated structural sheet, and a means to collect solar radiation superposed on the substrate layer.

The substrate layer can in one example be composed of a waterproof, rigid material that is thin in cross-section, such as marine plywood, Nyloboard™ (Nyloboard LLC, Covington, Ga.), or an equivalent water-resistant material of adequate structural capacity. Any type of solar collection means may be employed, but preferred are photovoltaic laminates. The photovoltaic film laminate material can be secured to the top of the substrate layer by any appropriate means. Exemplary are tacks, clips, straps, hold downs, fasteners, and adhesives, with integral adhesives being preferred. When the canopy deck pairs span from one wing arm to the next, the number of canopy decks required can be one less than the number of wing arms and support columns. In an alternative embodiment, the canopy decks can be twice or thrice as wide, so that additional wings are spanned by each canopy deck.

The solar canopy can further include a trough that can be formed and positioned centrally extending longitudinally between the proximal edges of the decks where those proximal edges form a structural spine of the assembly. The trough extends lengthwise or longitudinally from the first pair of wing arms to the terminal pair of wing arms.

Water storage means can be positioned above or below ground level, preferably below the level of the wing members. Means can be provided to transport water from the overhead trough into the water storage means. When the support columns are hollow, the support columns can comprise the water transport means In such case, a hole in the trough concentrically located over the open top end of the support column can allow water to drain from the trough into the support column, and a hole in the top of the water storage means can allow water to drain from the support column into the water storage means by way of a coupling pipe. An optional rain leader tube may be positioned inside the top of the support column to better direct the flow of water down the column. The rain leader tube may be a separate piece or it may be integral with the trough and have a diameter smaller than the diameter of the support column. In the latter case, the rain leader tube can have a diameter identical to the diameter of the hole in the trough. As a separate piece the rain leader tube may be slightly larger in diameter than the diameter of the hole in the trough and smaller than the diameter of the support column. In either case, the rain leader tube projects into the top of the hollow support column.

When the support columns are solid, a separate water conductor mounted adjacent to the support column can be employed. The separate water conductor may be in the form of a tube, however, the shape is unimportant as long as the conductor has the ability to transfer the water from the overhead trough into the water storage means. In such case a hole in the trough, optionally with an integral rain leader, is positioned to project into and drain water directly into the separate water conductor. The water exits the conductor via a coupling pipe and passes through a hole in or near the top of storage means.

When the water storage means is positioned below ground level, it and the support columns and vertically disposed hollow tubes if present are mounted on an underground footing formed and positioned to support their weight and resist superimposed structural loads. When the water storage means is positioned above ground, the support columns may be directly mounted onto the ground surface, such as onto paving or a pier. In an alternate embodiment, water storage means may be hung from the wing arms at an appropriate height. In this embodiment, water collected in the water storage means can be used with the need for a separate pump. This would be of particular advantage is the assembly is employed in its marine application.

The dual-inclined, arcuate wing arms and the support columns may be composed of high strength-to-weight ratio material. Exemplary materials that may be employed include plastic, fiberglass, aluminum, aluminum alloy, fiber reinforced plastic, composites, composite wood, carbon fiber, or any other suitable material or combination thereof. Fiber reinforced plastic is preferred.

The support columns could be composed of the same or a different high strength to weight ratio material. If the support columns are hollow and are used for water transport, the columns should be composed of a material that will not decay in the presence of water, such as plastic, fiberglass, fiber reinforced plastic, or carbon fiber.

In another embodiment, the plurality of spaced-apart structural arms may be replaced with a single pair of continuous wings that extend along the length of the entire canopy structure. In this embodiment, the corrugated structural sheet, substrate, and photovoltaic laminate forming the canopy deck are superposed atop the continuous wings in that order. An extremely light-weight material can be employed, such as Nomex® honeycomb panels (DuPont, Wilmington, Del.). The continuous, arcuate wings of this embodiment have an upper portion and a lower portion and can be hollow except for one or more fixed braces, or spars, extending between the upper and lower portions of the wings. The arcuate wings have proximal ends and distal ends, and the proximal ends are arranged to be in opposed relation to each other to form a structural spine in the assembly. The curvature in the downwardly-sloping, arcuate, continuous wing arms begins at the distal ends of the wing arms and increases in steepness toward the proximal ends of the arms and the structural spine. The upper and lower portions meet distally in a distal terminus as in the first described embodiment.

The water storage means should be composed of concrete, fiberglass, metal, or other suitable waterproof material or combination thereof. The water storage means can take the form of a substantially horizontally disposed, rigid, tubular container similar to a water drain pipe of the sort used for water run-off. The container can be capped or sealed at each end and can extend the length of assembly in substantially the same plane as the structural spine. Such containers are known in the art. See for example, U.S. Patent Publication No. 2009/0230142 and U.S. Pat. Nos. 4,190,187; 5,954,224; 5,979,748; and 6,852,267.

To facilitate use of the solar power collected by the canopies, the assembly can include at least one inverter to convert direct current from the solar collection means to alternating current for storage and/or distribution. In addition, to maximize its functionality, the system can include at least one vehicle charging outlet, the outlet being able to draw electric power from the inverter, or grid, to charge electric vehicles or other equipment.

In another aspect, the invention comprises a kit for constructing an arcuate winged solar canopy comprising least two pairs of dual-inclined wing structural arms. The arms are composed of a first pair of low-incidence, downwardly-curved or arcuate wing arms and a second pair of low-incidence, downwardly curved or arcuate wing arms. Each of the first and second pairs of downwardly-curved arcuate wing arms has a proximal end and distal end. The proximal ends in each pair are arranged to be in opposed relation to each other forming a structural spine in the assembly. The curvature in the downwardly-sloping, arcuate, wing arms begins at the distal ends of the wing arms and increases in steepness toward the proximal ends of the arms and the structural spine. For stability, the wing arms increase in thickness from their distal ends, which are relatively thin, to their proximal ends, which are relatively thick. In other words, beginning from the proximal ends, the wings arms taper in thickness approaching the distal end, and terminate in a tapered end.

The kit of the invention also includes at least two support columns for supporting the wing arms. A first support column is end-mounted on a ground surface or underground at its lower end and extends vertically along a substantially longitudinal axis to support at its other end the weight of the first pair of dual-inclined wing structural arms. A second support column is likewise end-mounted on a ground surface and extends vertically along a substantially longitudinal axis to support at its other end the weight of the second pair of dual-inclined wing members. The support columns have a height sufficient to enable vehicles to traverse or park underneath the canopy assembly. When installed, the distance between the support columns and their corresponding structural arms is variable, a typical distance being between about 9 ft to about 15 ft. Additional support columns and wing structural arms may be included in the kit and arranged in the same fashion.

The kit further includes at least one pair of rigid canopy decks. The canopy decks are formed and positioned to span from one wing member pair to another wing member pair and are mounted on the top surface of each wing member at the deck edges. The decks are further formed and positioned to follow the curvature of the pairs of low-incidence, arcuate wing arms. The length of each deck substantially conforms to the length of the wing arm, and the width of each deck is such that the deck can be mounted at it edges onto the top of wing arm. Each of the canopy decks in the assembly can be composed of a corrugated structural sheet or its equivalent, a substrate layer superposed on the corrugated sheet, and a means to collect solar radiation superposed on the substrate layer. Any type of solar collection means may be employed, but preferred are photovoltaic laminates. One such laminate is manufactured and sold by Uni-Solar, United Solar Ovonic LLC (Rochester Hills, Mich.). The photovoltaic film laminate material is secured to the top of the substrate layer by any appropriate means, such as tacks, clips, straps, and adhesives, with integral adhesives being preferred. The number of canopy decks included in the kit can be one less than the number of support columns and wing arms provided in the kit.

The kit further includes a trough formed and positioned between the proximal edges that form the structural spine of the assembly. The trough is formed to extend longitudinally from the first pair of wing arms to the second pair of wing arms, or the last pair of wing arms if more than two are provided in the kit, as already described.

Additional elements that may be included in the kit include water storage means as described above that can be positioned either above or below ground level, preferably below the level of the wing members. Means can be provided for transporting water from the overhead troughs into the water storage means, also as described above. When the support columns are hollow, the support columns can comprise the water transport means. In such a case, a hole in the trough directly above the open top end of the support column will allow the water to drain from the trough into the support column, and a hole in the top of the water storage means will allow the water to drain from the support column into the water storage means. When the support columns are solid, a separate water conductor mounted adjacent to the support column can be employed. The separate water conductor may be in the form of a tube. However, the shape is unimportant as long as the conductor has the ability to transfer the water from the overhead trough into the water storage means. In such a case, a hole in the trough is positioned to drain water directly into the separate water conductor, and the water exits the conductor via a hole in the storage means. When the water storage means is positioned below ground level, it and the support columns and vertically disposed hollow tubes if present are mounted on an underground footing formed and positioned to support their weight and resist superimposed structural loads.

In another embodiment of the design, the wing structural arms included in the kit may be replaced with a pair of continuous wings that extend along the length of the entire canopy structure, as opposed to a plurality of pairs of wings that are in spaced apart relation to each other extending along the length of the entire canopy structure. The continuous arcuate wings of this embodiment have an upper panel and a lower panel and are hollow except for one or more fixed braces extending between the upper panel of the wings and the lower panel of the wings. Like the first embodiment, the arcuate wings have proximal ends and distal ends, and the proximal ends are arranged to be in opposed relation to each other thereby forming a structural spine in the assembly. The curvature in the downwardly-sloping, arcuate, continuous wing arms begins at the distal ends of the wing arms and increases in steepness toward the proximal ends and structural spine.

In yet another aspect, the invention comprises a method for providing a solar canopy assembly of the invention. The method includes erecting the support columns included in the kit in a space-apart manner such that they extend substantially vertically along their longitudinal axes and are far enough apart so that a vehicle is able to traverse between them. Each pair of dual-inclined wing members included in the kit are mounted at their proximal ends on or near the top of each support column such that the proximal ends in each pair are in opposed relation to each other and form a structural spine in the assembly. The pairs of canopy decks, which are formed and positioned to follow the curvature of the pairs of low-incidence, downwardly curved wing arms, are mounted on the wing members at their edges so that they span from wing arm to wing arm. A water trough is next disposed between the proximal edges of the wing members forming the structural spine and extending lengthwise from wing arm to wing arm. The additional elements included in the kit as described above may then be positioned.

One will appreciate that the foregoing discussion broadly outlines the more important goals and features of the invention to enable a better understanding of the detailed description that follows and to instill a better appreciation of the inventor's contribution to the art. Before any particular embodiment or aspect thereof is explained in detail, it must be made clear that the following details of construction and illustrations of inventive concepts are mere examples of the many possible manifestations of the invention.

BRIEF DESCRIPTION OF THE DRAWINGS

FIG. 1 is a cross-sectioned view in side elevation of a solar canopy according to the invention taken along the line 1-1 in FIG. 2;

FIG. 2 is a top plan view of a solar canopy pursuant to the invention;

FIG. 3 is a view in front elevation of a solar canopy as taught herein;

FIG. 4 is a view in side elevation of one half of the wing structure of the solar canopy;

FIG. 5 is a view in side elevation of an alternative embodiment of the wing structure according to the invention;

FIG. 6 is a view in side elevation of a bottom portion of the support column element of the solar canopy;

FIG. 7 is a sectioned top plan view of the bottom portion of the support column of FIG. 6;

FIG. 8 is a cross-sectioned plan view of a top portion of a support column taken along the lines 8-8 in FIG. 4;

FIG. 9 is a view in front elevation of the top portion of the support column taken along the line 9-9 in FIG. 4;

FIG. 10 is a cross-sectioned view of the top portion of the support column taken along the line 10-10 in FIG. 9;

FIG. 13 is a view in side elevation of a unified wing arm structure according to the invention retained relative to an upper end of a support column;

FIG. 14 is a top plan view of the unified wing arm structure of FIG. 13;

DETAILED DESCRIPTION

Figure 11:
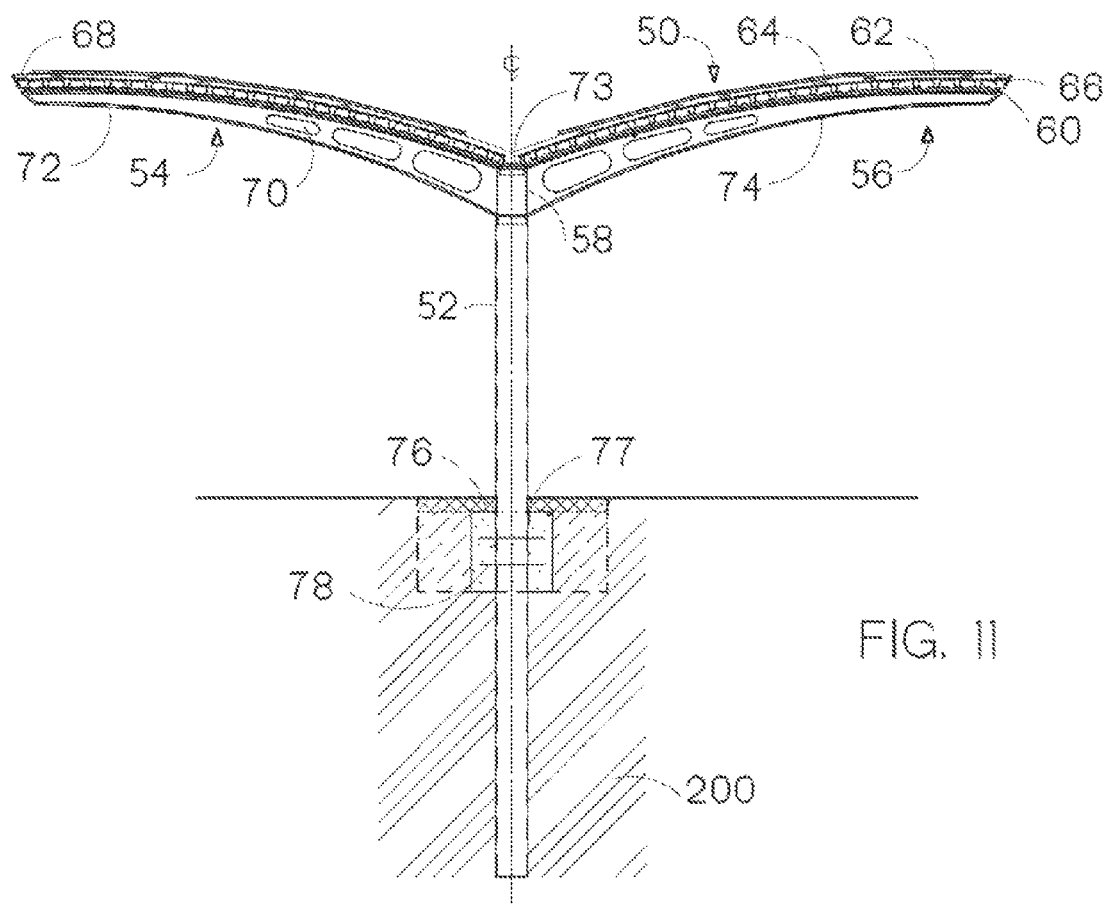
FIG. 11 is a partially sectioned view in side elevation of an alternative solar canopy structure as taught herein.
Figure 12:
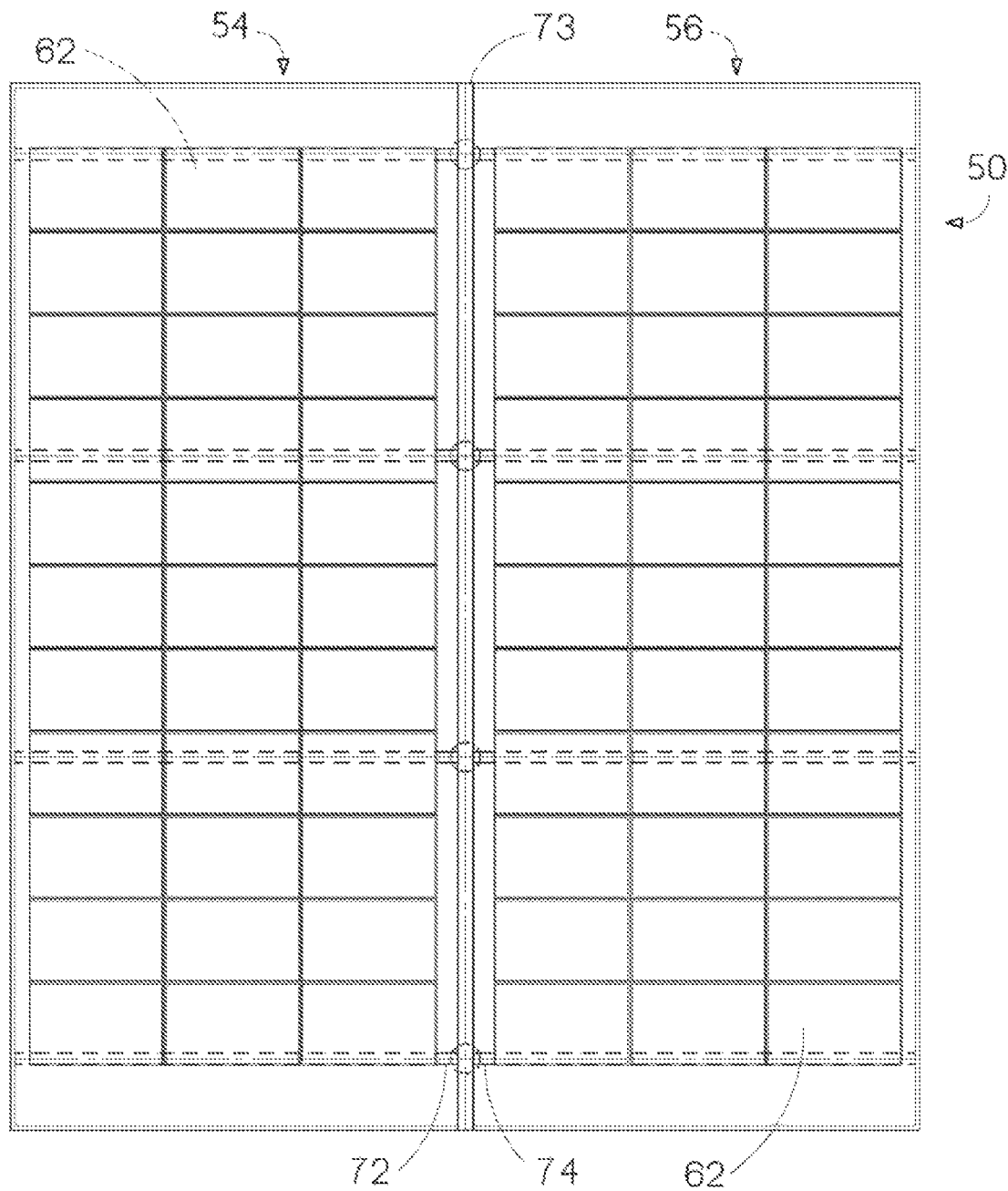
FIG. 12 is a top plan view of the solar canopy structure of FIG. 11.
Figure 16:
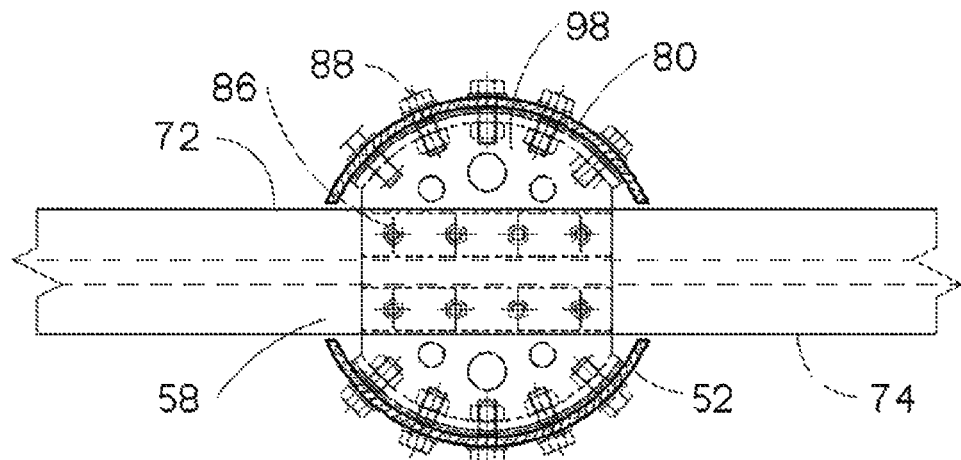
FIG. 16 is an amplified top plan view of the central portion of the unified wing arm structure of FIG. 15.
Figure 15:
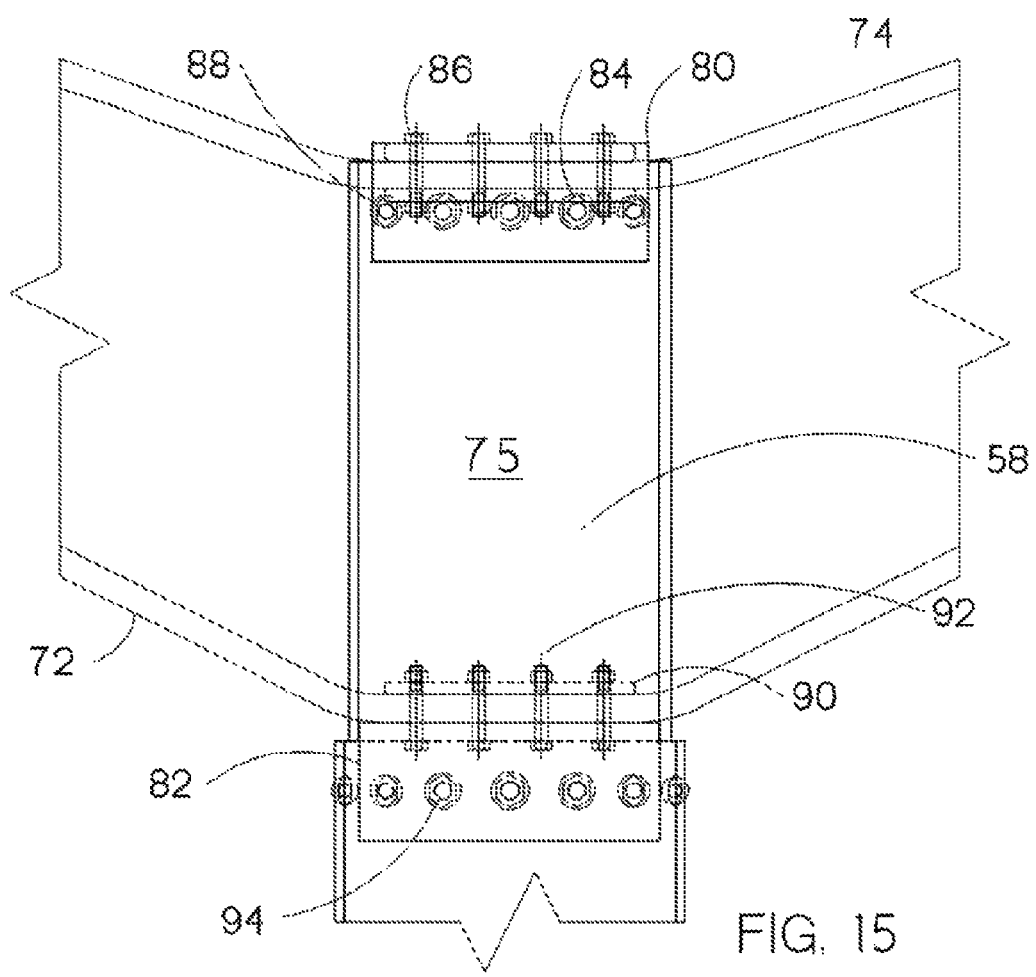
FIG. 15 is an amplified view in side elevation of a central portion of the unified wing arm structure of FIG. 13.
Figure 17:
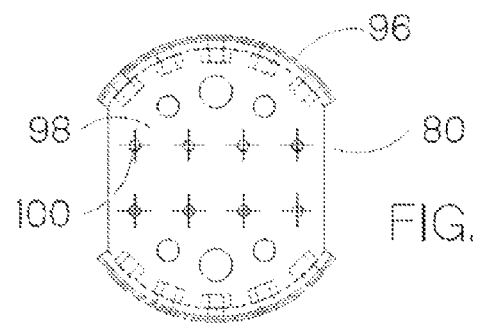
FIG. 17 is a top plan view of an upper bracket for coupling the unified wing arm structure to the support column.
Figure 19:
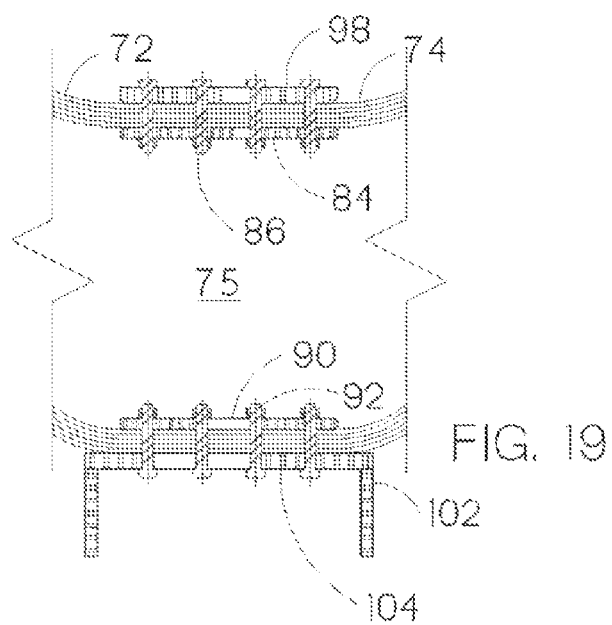
FIG. 19 is a cross-sectional view of the unified wing arm structure coupled to the support column by the upper and lower brackets taken along the line B-B in FIG. 16.
Figure 18:
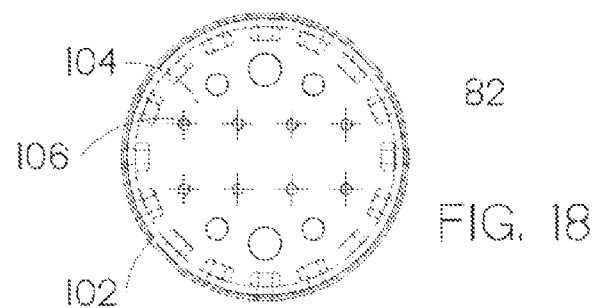
FIG. 18 is a top plan view of a lower bracket for coupling the unified wing arm structure to the support column.

The solar canopy assembly disclosed herein is subject to widely varied embodiments. However, to ensure that one skilled in the art will be able to understand and, in appropriate cases, practice the present invention, certain preferred embodiments of the broader invention revealed herein are described below. Therefore, before any particular embodiment of the invention is explained in detail, it must be made clear that the following details of construction and inventive concepts are mere examples of the many possible manifestations of the invention.

FIG. 1 shows a preferred embodiment of the canopy assembly 25. In FIG. 1, canopy assembly 25 is composed of support column 1 which extends substantially vertically from below ground level to a height sufficient to permit the parking of vehicles or storage of equipment under attached wing member 2. Support columns 1 may have a cylindrical shape, although other shapes may be employed, such as, but not limited to, an open box, octogonal, hexagon and the like. Wing member 2 is composed of two arcuate, structural arms 3 attached to support column 1 at one end by means of wing connection flange 5. Mounted on wing structural arms 3 are structural canopy decks (unnumbered) composed of three elements 8, 10 and 11. The structural canopy decks are composed of corrugated structural sheet 8 that could, for example, be made of fiberglass, aluminum or fiber reinforced plastic, or any other suitable material. The decks are positioned on structural arm 3 such that the deck's parallel ridges and furrows run parallel to the support columns 1 as can best be seen in FIGS. 1 and 3. The structural canopy decks and structural sheet 8 substantially conform in length to the length of the wing arms 3 and are wide enough to span from one wing arm pair to another wing arm pair.

A substrate 10 is superposed, mounted on, and attached to the ridges of structural deck 8. Substrate 10 provides a thin, flat surface onto which the solar collectors or means for collecting solar radiation 11 are positioned. Substrate 10 may be composed of any type of waterproof or water resistant planar material that can conform to the arcuate shape of wing member 2. Superposed on and attached to the upper surface of substrate 10 is solar radiation collection means 11. Solar radiation means 11 may comprise a photovoltaic film laminate, a preferred means for the collection of solar radiation. Such flexible photovoltaic panels or films that can be mounted on curved structures are known in the art. One such film laminate is available through Uni-Solar, United Solar Ovonic LLC (Rochester Hills, Mich. 48309).

Dual-inclined wing structural arms 3 are formed with a low-incident, arcuate curve that downwardly slopes proximal to a peak portion toward the proximal ends of the arms 3. The distal extremes of the arms 3 can approach or become horizontal or tend toward a slight downward inclination beyond the peak portion. The arms 3 are positioned with one end proximal to the support column 1 and the other end distal to the support column 1. The curvature in the structural arms 3 begins at the distal end and increases in steepness near the proximal ends, and the height or thickness dimension of the structural arms 3 also increases from the distal to proximal ends as can best be seen in FIG. 1. The actual height (from arm bottom to arm top) and length (from distal end to proximal end) of the wing arms 3 throughout their span is dependent on the length of the span, the weight of the structural deck, substrate, and solar collector 11, and the environment in which the assembly will be used. Preferably, the top and bottom of the structural arms 3 taper or decrease in height as they approach the distal ends to meet and form a taper terminus at the distal ends of the arms 3. The determination of an appropriate height and length is within the level of skill in the art.

Structural arms 3 can be constructed with a plurality of optional cut-outs, or ovoid holes to minimize weight. As also shown in FIG. 1, the proximal ends of the arms are in opposed relation to each other, thereby forming a structural spine in the assembly running from support column 1 to support column 1. Water trough 12 is formed and positioned atop the structural spine with the bottom of the trough 12 positioned directly on the spine, and the sides of the trough 12 adjacent to and meeting the proximal ends of the wing arms 3 such that the trough 12 is able to collect water (or snow).

Preferably, the trough 12 is formed with least one hole (not numbered) positioned concentrically over support column 1 as best seen in FIG. 2. Mounted inside support column 1 is cylindrical rain leader 13 extending from trough 12 into support column 1. Rain leader 13 is formed and positioned to direct the water collected in the trough 12 into support columns 1. The diameter of the rain leader 13 is the same as or greater than the diameter of the hole in the trough 12. Also mounted within support columns 1 are column closure discs 14 disposed near the bottom of the support column 1 as shown, for example, in FIG. 3. The discs 14 are positioned within the columns 1 with the disc edges abutting the interior surfaces of the columns 1 and having planar surfaces substantially perpendicular to the longitudinal axis of the column 1 thereby creating a false bottom in the column 1.

The two wing arms 3 can be mounted on support column 1 by a separate mounting member, or the arms 3 may be formed with an integral, flanged, mounting cylinder. That latter embodiment is shown in the figures and best seen in FIGS. 8-10. Referring now to FIG. 8, there is shown in cross sectional plan view wing arms 3, each of which terminates in integral half-cylinder wing connection flange 5. Each flange 5 is formed in mating half-cylinders which enclose support column 1 and are formed with integral longitudinally-flanged edges. The flanged edges have a series of holes arranged longitudinally from top to bottom as shown in FIG. 9. The mating half-cylinders of the flanges 5 are positioned such that their flanged edges mate. Wing flange connection bolts 6 extend through the series of holes to secure the pairs of wing arms 3 together tightly surrounding the top of support column 1. The centrally disposed rain leader 13 and water trough 12 can again be seen in FIGS. 9 and 10 where the relevant portions of wing arms 3 are shown to be secured to support column 1 in side elevation views. A series of wing connection bolts 6 extend through holes disposed in the mating flanged portions of the wing connection flanges 5.

Water trough 12 is positioned above and rests on the top end of support column 1 and the mating flanged portions of the integral wing connection flanges of wing structural arms 3. Trough 12 is formed with a flat bottom, and opposed, upwardly extending, parallel sides that bend outwardly at the uppermost portion forming dog legs 23 so as to fit under the proximal edges of corrugated structural sheet 8 as best seen in FIG. 4. Optionally, trough 12 may be formed with an integral centrally mounted splashguard to assist in maximizing the amount of rainwater caught by trough 12. Cylindrical rain leader 13, which can be open on both ends, has a diameter the same as or slightly greater than the diameter of the hole in trough 12 for the purpose of leading the water into support column 1. Deck attachment block 7 provides additional stability to the structural arms at their mounting point on support column 1.

FIG. 2 is a plan view of the canopy assembly 25 of the invention illustrating the general position of structural arms 3 beneath and supporting structural sheet 8, substrate 10, and solar collectors 11. Three structural arms 3 are illustrated in this figure, and only two of which have rain leaders 13 for water collection. The maximum number of rain leaders 13 employed may be limited by the number of support columns 1. In such a case, any number equal to or less than the number of support columns 1 will work, although many less may be necessary to allow the flow of water into the support columns 1 in the given environment in which the canopy assembly 25 is used. As can be seen, structural arms 3 are in regular spaced-apart relation to each other to permit parking and movement of vehicles under the canopy assembly 25.

FIG. 3 is a view in front elevation view of the canopy assembly 25. There, a plurality of spaced-apart support columns 1 are shown having a plurality of spaced-apart structural arms 3 supported thereby and mounted thereon by means of connection flange 5 and connection bolts 6. The columns 1 and structural arms 3 may be spaced any distance apart, although three different distances of 9, 12 and 15 feet are shown. Mounted on structural arms 3 is the canopy deck. At the distal edge of the deck there is formed and arranged deck closure bracket 9 extending longitudinally along the distal end of the deck to enclose the distal edge of the deck. Deck closure bracket 9 may be fastened to the deck by appropriate fastening means, or the bracket 9 may be formed to be demountably coupled to the distal edge and clipped into place without fasteners.

A water collection structure or means 17, which is sealed by a water cap 18 at each end, is shown extending longitudinally beneath the ground surface the entire length of canopy assembly 25. Collection means 17 is connected to water trough 12 by means of structural arm 3 as discussed in general terms previously. Structural arm 3 is formed having one or more bore(s) 15 through its side and positioned slightly above or vertically higher than the top of water collection means 17. A coupling pipe 16 as seen in FIG. 1 extends between bore 15 and collection means 17 to enable water to flow from the column 1 into the water collection structure 17. As illustrated in FIG. 3, bore 15 is positioned high enough on structural arm 3 so that gravity flow is used to move the water from the water trough into the water collection means 17 but bore 15 is not positioned so high that coupling pipe 16 is very long to minimize the chance of pipe breakage. Below bore 15 and mounted within wing structural arm 3 is column closure plate 14, which provides a bottom to prevent water leakage from reaching and damaging the bottom of the structural arm 3 at its mounting end. Collection means 17 is, in a preferred embodiment, made of tubular HDPE pipe. However, other water-tight containers are well known in the art and may be used for this purpose.

In operation, rain or snow hits the canopy deck and is shunted into water trough 12 by means of the arcuate sloping of the deck. From the trough, the rain or snow enters the support columns 1 by means of the holes in the columns 1 and the optional rain leaders 13. Gravity then carries the water or snow, 19 into water storage means 17. Support columns 1 can be mounted on underground footings 21, which are surrounded by structural fill 22. Alternatively, the support columns 1 may be mounted above-ground. The mounting means is discussed in detail below, including in reference to FIGS. 6 and 7.

Also shown in FIG. 3 are an inverter 23 and a vehicle charging outlet 24, which potential embodiments of the solar canopy 25 might employ. Inverter 23 converts direct current from the solar collectors 11 to alternating current for storage and/or distribution. Vehicle charging outlet 24 is coupled to and able to draw electric power from the inverter 23 to charge electric vehicles or other electric equipment. How these elements are positioned in the canopy assembly 25 is not critical, so long as they can be accessed and made use of by vehicles and the like. This is within the level of skill in the art.

FIGS. 4 and 5 illustrate alternative embodiments of the wing structural arms 3 of the assembly 25. In FIG. 4, the arm 3 is shown with integral wing connection flange 5 as discussed previously. Bracket shaped deck closure plate 9 covers the distal end of the arm 3 for cosmetic purposes as briefly discussed above. The edges of the canopy deck are affixed to the top of wing structural arm 3 by means of a mounting in or on the furrows of corrugated sheet 8. This mounting may a permanent mounting or, preferably, the deck may be removably affixed, for example by a plurality of bolts extending through mating holes in the furrowed portion of the deck and in the arm 3, or by a plurality of screws. Methods of either permanent or removable affixation are known in the art and may be employed for this purposed. Resting and superposed on the ridges of corrugated sheet 8 is substantially planar, flexible substrate 10, the side edges of which are affixed to the ridge portions of deck 8. Superposed on the top surface of substrate 10 and extending on all sides to the edges of the substrate is flexible photovoltaic laminate solar collection material 11, and water trough 12 is shown centrally disposed with its dog leg upper portion contiguous with the underside of the deck ridge.

FIG. 5 illustrates a second embodiment of the wing structural arm of the assembly in which the plurality of paired, space-apart wing structural arms are eliminated and replaced by a pair of continuous wings 40 that extend longitudinally along the entire canopy structure. The continuous arcuate wings 40 of this embodiment have an upper panel 43 and a lower panel 44 and are hollow except for one or more fixed braces or spars 41 extending between the upper panel 43 of the wings 40 and the lower panel 44 of the wings 40. Like the first embodiment, hollow continuous wings 40 are formed with a low-incident, arcuate, downwardly-sloping curvature approaching the proximal ends thereof and are positioned with one end proximal to support column 1 and the other end distal to the support column 1. As in the first embodiment, the continuous arcuate wings 40 have proximal ends 45 and distal ends 46, and the proximal ends are arranged to be in opposed relation to each other forming a structural spine in the assembly. The arcuate curvature in the continuous hollow wings 40 begins at the distal end and increases in steepness near the proximal ends of the wings 40. The height dimension of the hollow wings 40 also increases from the distal to the proximal ends of the wings 40. Stated alternatively, the separation between the upper and lower panels 43 and 44 tapers or decreases approaching the distal end of the wings to form a taper terminus at distal end 46. The actual height and length from distal end to proximal end of the hollow wings 40 throughout their span is dependent on the length of the span, the weight of the structural sheet, substrate, and solar collection means, and the environment in which the assembly will be used.

The same mounting means may be employed to attach hollow wings 40 to support columns 1 as in the first embodiment. The upper panel 43 of the continuous wings forms a structural deck upon which at least one solar collector 11 is permanently or removably affixed on the top surface. The solar collection means 11 is preferably a flexible photovoltaic laminate that can be rolled into position on the top surface of the continuous wings 40 and fixed thereto by any appropriate means, for example clamps, clips, pins, screws, bolts and other hold downs and fasteners that can be removed to simplify replacement of the laminate.

FIGS. 6 and 7 illustrate one configuration in which support columns 1 can be mounted to either pavement or to underground footing 21 as illustrated in FIG. 1. In either case, the bottom end of each support column 1 is secured in a substantially vertical manner by means of annular restraint collar 20, which is bolted in place on the pavement or to the top of underground footing 21 by means of bolts 31. Collar 20 has a flat bottom plate 30, a centrally disposed upwardly extending annular collar, and a plurality of angled, stabilizing flanges 29 that assist in maintaining support column 1 in a substantially vertical manner. Collar 20 may be formed from any type of heavyweight, rigid material, for example, steel or other metal alloy.

As discussed above, the originally disclosed solar canopy structure has proven to accomplish plural advantages and to be an inventive improvement over the prior art. However, even that inventive canopy structure left challenges that hindered its application and performance. With those challenges and shortcomings in mind, the inventor conceived of the improved solar canopy structure, which is indicated generally at 50, described below and shown in the accompanying FIGS. 11 through 19.

The solar canopy structure 50 again has first and second opposed arcuate wing arms 72 and 74 that are supported by columns 52. Corrugated decking 60 is fixed to the wing arms 72 and 74 in conformity with the arcuate profiles of the arms 72 and 74. A substrate layer 65 that is substantially continuous and smooth is fixed to the upper surface of the corrugated decking 60. The combination of the corrugated decking 60, which is substantially exposed on its lower surface, and the smoothness of the exposed upper surface of the substrate layer 65 is advantageous in that the exposed corrugations on the lower surface disrupt airflow and proportionally lessen uplifting forces presented by incident wind that would otherwise be exhibited by a smooth surface while the exposed smooth upper surface permits the travel of water and other materials over the top of the unified structure formed by the decking 60 and the substrate 65.

Photovoltaic panels 62, which can be as previously described, are secured to the decking 60, such as by spaced mounts 64. First and second opposed, arcuate solar canopies 54 and 56 are thus established with a trough 73 again formed between the proximal edges of the decking 60. Angled trim 66 can be fixed to the distal edges of the decking 60 to establish an angled leading edge of each arcuate solar canopy 54 and 56 to improve wind deflection. Moreover, arcuate deck closure plates 68 can be fixed to the lateral edges of the decking 60 thereby to improve wind performance further and to establish a weather-tight installation. Voids 70 can be formed in the wing arms 72 and 74, such as by cutting or on initial formation, to permit the passage of wind from directions lateral to the solar canopy structure 50.

Figure 20:
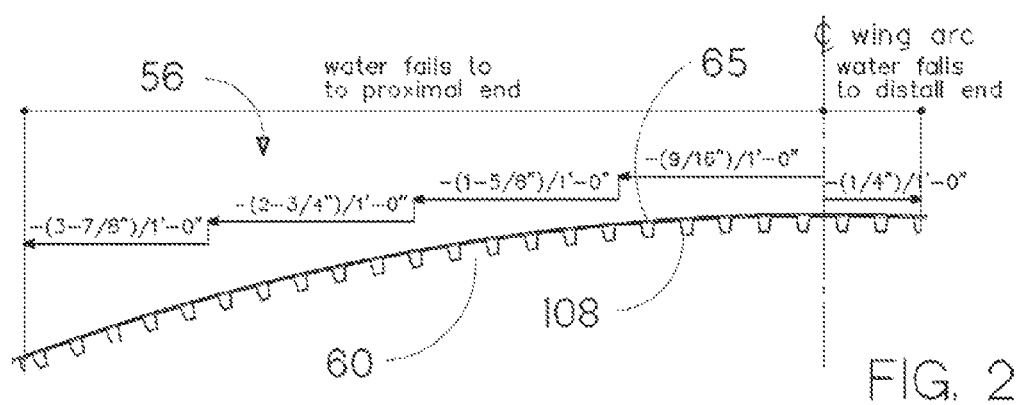
FIG. 20 is a schematic view in side elevation a canopy wing as taught herein showing the water transport characteristics thereof.
Figure 21:
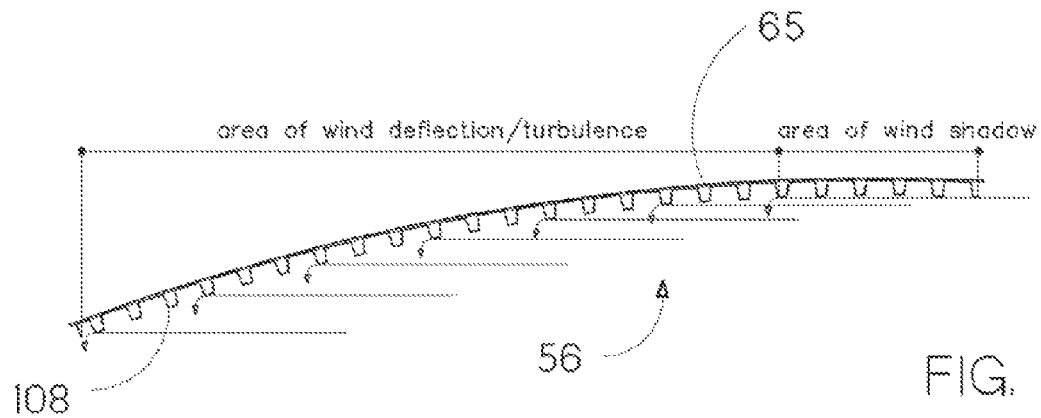
FIG. 21 is a schematic view in side elevation a canopy wing as taught herein showing the wind deflection characteristics thereof.

As seen in FIGS. 20 and 21 where just the second solar canopy 56 is shown schematically, the decking 60 can again have corrugations 108 along the lower surface thereof with the corrugations 108 traveling parallel to the proximal and distal edges of the decking 60 for optimal wind performance as shown in FIG. 21. Moreover, looking to FIG. 20, the arcuate shape of the solar canopy 56 can have a high point proximal to the distal edge of the decking 60 and the overall canopy 56. With that, incident precipitation proximal to the high point will tend to travel proximally, and incident precipitation distal to the high point will tend to travel distally. The downward tipping of the distal portion of the canopy 56 contributes to the areas of the wind shadow and avoids the presentation of an air scoop effect that would otherwise be developed. More particularly, in the present example, a downward tipping of the distal approximately two feet of the decking 60 and the substrate 65 tends to bifurcate incident wind. The downward tipping of the decking 60 and the substrate 65 and, additionally or alternatively, the exposed corrugated lower surface of the decking 60 produces what can be referred to as a wind shadow at and around the aforedescribed distal end portions of the decking 60 and the substrate 65. This wind phenomenon derives not only from the corrugations of the decking 60 but also from the maximum height of the decking 60 and the retained substrate 65 being spaced inboard, in this example by approximately two feet out of an overall eighteen foot span or approximately 10% to 15% or more precisely 11.1%, from the distal edges of the decking 60 and the substrate 65. Notably, if the top of the wing arc were at the distal ends of the decking 60 and the substrate 65, an air scoop would be presented, which would produce undesirable lift. Furthermore, if the top of the arc were substantially more inboard from the edges, excess incident precipitation would be directed outward and excess downward wind forces would be confronted.

To overcome the need for the large concrete footings and the undesirable excavation, wasted energy, and other inherent characteristics thereof, the applicant has devised of the installation structure and method depicted, for example, in FIG. 11. There, the column 52 has a lower portion deeply embedded in a volume of ground 200. More particularly, the column 52 in this instance has greater than one-half of its overall length embedded below the surface of the ground 200. For instance, where the column 52 has an overall height of slightly over 26 feet, 14 feet of the column 52 or about 54 percent thereof is disposed below the surface of the ground 200.

The installation of the column 52 into the ground 200 can be accomplished in any effective manner within the scope of the invention except as it might expressly be limited by the claims. In a presently preferred practice of the invention, the columns 52 can be impervious and hollow. So constructed, the columns 52 can be driven into the ground 200, such as by an impact driver, to the desired depth, which can be determined based on, among other things, soil characteristics, the size of the opposed first and second canopy wings, which are indicated generally at 54 and 56 in FIG. 11, and other factors. As such, the columns 52 tend to drive into the ground in what can be referred to as a straw method. Where necessary, such as in the face of bedrock or other soil conditions, auguring or other soil preparation can be undertaken to facilitate the insertion of the columns 52.

The structural stability of the column 52 can be enhanced by establishing a point of fixity 77 spaced from the lower end of the column 52 to resist displacement and any overturning moment. In this example, the point of fixity 77 is established spaced from the lower end of the column 52 and along the body portion thereof just below or even with the surface of the ground 200. While a number of mechanisms for establishing a point of fixity 77 may occur to one knowledgeable in the art after reading this disclosure, one presently contemplated embodiment of the solar canopy structure 50 has a point of fixity 77 established by a restraint block 76 fixed to the mid-portion of the column 52. For example, the restraint block 76 could be a concrete block.

For the structure 50 shown in the drawings, a minimal 1-cubic yard restraint block 76 has been calculated to suffice. Larger or smaller structures 50 will likely involve differently sized restraint blocks 76. Advantageously, by employing this deeply embedded column 52 in combination with a point of fixity established by the restraint block 76, the volume of the block 76 is able to reduced to approximately ⅙ of the volume of the footing 21 in the embodiment of FIG. 1. The restraint block 76 is attached to the column 52 by reinforcing bars 78 that penetrate the column 52 and project to opposing sides thereof in general alignment with the wing arms 72 and 74. As such, use of the restraint block 76 in combination with the deeply embedded column 52 permits the use of a relatively small volume of material near the surface rather than a major footing 21 situated in a relatively deep excavation. Consequently, significant cost savings are realized together with a more efficient design and lower negative environmental impacts. Based on its reduced size and volume, the restraint block 76 can be pre-cast, so that delays from curing time at the installation site can be wholly eliminated.

The embodiment of the solar canopy structure 50 of FIGS. 11 through 19 also addresses the above-described deficiencies relating to the separate wing arms 3 and the need to form and bolt relatively complicated flanges 5 in place to retain them relative to support columns 1. To do so, the inventor has conceived of forming the opposed arcuate wing arms 72 and 74 joined together by a central portion 75 to form a continuous, unitary wing arm structure. The unified structure formed by the wing arms 72 and 74 and the central portion 75 has an I-shaped cross section along at least substantially the entire length thereof that has a maximum cross-sectional height at the central portion 75 and that tapers progressively along the lengths of the wing arms 72 and 74 as the supported weight progressively diminishes. The wing arms 72 and 74 and the central portion 75 can, in one instance, be formed as composite structures for optimal strength and weight characteristics.

The upper portion of the support column 52 has a U-shaped receiving channel 58 that passes entirely therethrough, and the continuous wing arm structure passes directly through the receiving channel 58 to be supported by the column 52. The wing arm structure formed by the arms 72 and 74 and the central portion 75 is secured relative to the column 52 by upper and lower brackets 80 and 82 that are mutually fixed to the column 52 and the central portion 75. As can be perceived by combined reference to FIGS. 14 through 19, the upper bracket 80 has an annular peripheral wall 96 sized to be received into the upper portion of the column 52, a base plate 98, and first and second lines of fastening apertures 100 formed in the base plate 98. In practice, the peripheral wall 96 can be formed from a section of steel or other pipe, and the base plate 98, which can be joined with the peripheral wall 96 by welding, can be an appropriately configured section of steel plate material. The peripheral wall 96 has opposed open portions for receiving the central portion 75 therethrough. The upper bracket 80 can thus be applied with the base plate 98 atop the central portion 75 and the peripheral wall 96 overlapping with the tip of the column 52. Fasteners 86 can be passed vertically through the apertures 100, the central portion 75, and a washer plate 84, and fasteners 88 can be passed laterally through the peripheral wall 96 and the column 52.

The lower bracket 82 has a continuous annular peripheral wall 102, a base plate 104, and first and second lines of fastening apertures 106 formed in the base plate 104. So constructed, the lower bracket 82 can be inserted into the column 52 and secured in place at the base of the channel 58 by fasteners 94 passed through the peripheral wall 102 and the column 52, and the central portion 75 can be secured to the lower bracket 82 by fasteners 92 passed through the base plate 104, the central portion 75, and a washer plate 90.

With the upper and lower brackets 80 and 82 fixed to the column 52 and the central portion 75 fixed to the upper and lower brackets 80 and 82, the wing arms 72 and 74 are securely retained in a stable and elegant configuration that represents an advance even beyond the original solar canopy structure 25 of, for example, FIG. 1. In certain applications, the upper and lower brackets 80 and 82 can have threaded nuts welded to the interior portions thereof, and the brackets 80 and 82 can be pre-mounted on the bottom and top flanges of the central portion 75. With the brackets 80 and 82 so mounted, the central portion 75 can be inserted into the channel 58, and the fasteners 84 and 94 can be applied.

With a plurality of exemplary embodiments and details of the present invention for a solar canopy disclosed, it will be appreciated by one skilled in the art that changes and additions could be made thereto without deviating from the spirit or scope of the invention. This is particularly true when one bears in mind that the presently preferred embodiments merely exemplify the broader invention revealed herein. Accordingly, it will be clear that those with certain major features of the invention in mind could craft embodiments that incorporate those major features while not incorporating all of the features included in the preferred embodiments.

Therefore, the following claims are intended to define the scope of protection to be afforded to the inventor. Those claims shall be deemed to include equivalent constructions insofar as they do not depart from the spirit and scope of the invention. It must be further noted that a plurality of the following claims may express certain elements as means for performing a specific function, at times without the recital of structure or material. As the law demands, these claims shall be construed to cover not only the corresponding structure and material expressly described in this specification but also all equivalents thereof that might be now known or hereafter discovered.

The invention claimed is:

1. A freestanding solar canopy structure for being mounted in ground to receive solar energy and convert the solar energy to electrical energy, the solar canopy structure comprising:

at least one freestanding support column with a first end, a second end, and a body portion spanning from the first end to the second end wherein the second end of the at least one support column is embedded in the ground;

first and second solar canopies retained by the at least one freestanding support column in opposition, wherein the first and second solar canopies are arcuate in profile;

photovoltaic material retained by the at least one solar canopy; and a point of fixation established along the body portion of the at least one support column spaced from the first and second ends of the at least one support column wherein the point of fixation is established by a block of material fixed to the body portion of the at least one support column spaced from the first and second ends of the at least one support column adjacent to a surface of the ground.

2. The solar canopy structure of claim 1 wherein the block of material is fixed to the body portion of the at least one support column by at least one reinforcement bar with a portion disposed in the block of material and a portion fixed to the at least one support column.

3. The solar canopy structure of claim 2 wherein the block of material comprises a block of concrete.

4. The solar canopy structure of claim 1 wherein at least approximately one-half of the at least one support column is embedded in the ground.

5. The solar canopy structure of claim 4 wherein the at least one column is hollow.

6. The solar canopy structure of claim 1 wherein each of the first and second solar canopies comprises a wing arm, decking supported by the wing arm, and the photovoltaic material wherein the photovoltaic material is retained by the decking.

7. The solar canopy structure of claim 6 wherein the wing arms of the first and second solar canopies are joined by a central portion to form a unified, continuous wing arm structure.

8. A solar canopy structure for being mounted in ground to receive solar energy and convert the solar energy to electrical energy, the solar canopy structure comprising:

at least one support column with a first end, a second end, and a body portion spanning from the first end to the second end wherein the body portion has an annular cross section;

first and second solar canopies retained in opposition by the at least one support column wherein each of the first and second solar canopies comprises a wing arm, decking supported by the wing arm, and photovoltaic material retained by the decking;

wherein the wing arms of the first and second solar canopies are joined by a central portion to form a unified, continuous wing arm structure;

wherein the at least one support column has a channel formed therethrough and wherein the central portion of the wing arm structure is received in the channel;

an upper bracket and a lower bracket wherein the central portion of the wing arm structure is fixed within the channel in the at least one support column by the upper and lower brackets, wherein the upper bracket has a first portion having an annular peripheral wall matingly engaged with and fixed to the at least one support column adjacent to a distal end of the channel and a second portion fixed to the central portion of the wing arm structure, and wherein the lower bracket has a first portion having an annular peripheral wall matingly engaged with and fixed to the at least one support column adjacent to a base of the channel and a second portion fixed to the central portion of the wing arm structure.

9. The solar canopy structure of claim 8 wherein at least the central portion of the wing arm structure has an I-shaped cross section and wherein the second portion of the lower bracket comprises a base plate fixed to the I-shaped cross section of the central portion of the wing arm structure.

10. The solar canopy structure of claim 8 wherein the channel in the at least one support column is U-shaped.

11. The solar canopy structure of claim 8 further comprising a point of fixation established by a block of material fixed to the body portion of the at least one support column spaced from the first and second ends of the at least one support column.

* * * * *